United States Patent
Ginter et al.

(10) Patent No.: US 9,111,983 B1
(45) Date of Patent: Aug. 18, 2015

(54) METHODS FOR REMOVING ADHESIVE LAYERS FROM SEMICONDUCTOR WAFERS

(71) Applicants: Kevin P. Ginter, Apache Junction, AZ (US); Colby G. Rampley, Phoenix, AZ (US); Jeffrey L. Weibrecht, Gilbert, AZ (US)

(72) Inventors: Kevin P. Ginter, Apache Junction, AZ (US); Colby G. Rampley, Phoenix, AZ (US); Jeffrey L. Weibrecht, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/448,186

(22) Filed: Jul. 31, 2014

(51) Int. Cl.
*H01L 21/46* (2006.01)
*H01L 21/30* (2006.01)
*H01L 21/78* (2006.01)
*H01L 21/683* (2006.01)
*H01L 21/304* (2006.01)
*H01L 21/306* (2006.01)
*H01L 21/768* (2006.01)
*B32B 43/00* (2006.01)
*B32B 38/10* (2006.01)
*H01L 21/20* (2006.01)
*H01L 21/02* (2006.01)

(52) U.S. Cl.
CPC ............ *H01L 21/6835* (2013.01); *B32B 38/10* (2013.01); *B32B 43/006* (2013.01); *H01L 21/304* (2013.01); *H01L 21/30604* (2013.01); *H01L 21/768* (2013.01); *B32B 2457/14* (2013.01); *H01L 21/02* (2013.01); *H01L 21/2007* (2013.01); *H01L 2221/68327* (2013.01); *H01L 2221/68372* (2013.01); *H01L 2221/68381* (2013.01)

(58) Field of Classification Search
CPC . H01L 21/6835; H01L 21/2007; H01L 21/02; H01L 21/304
USPC ................... 438/455, 458, 459, 464
See application file for complete search history.

(56) References Cited

U.S. PATENT DOCUMENTS

| | | | |
|---|---|---|---|
| 7,932,123 B2 | 4/2011 | Rogers et al. | |
| RE43,587 E | 8/2012 | Orchard et al. | |
| RE43,605 E | 8/2012 | O'Brien et al. | |
| 9,029,238 B2 * | 5/2015 | Andry et al. | 438/458 |
| 2008/0003780 A1 | 1/2008 | Sun et al. | |
| 2014/0141253 A1 * | 5/2014 | Fujii et al. | 428/411.1 |
| 2015/0000834 A1 * | 1/2015 | Matsushita et al. | 156/272.6 |
| 2015/0035554 A1 * | 2/2015 | Dang et al. | 324/756.01 |

OTHER PUBLICATIONS

Webb, "Temporary Bonding Enables New Processes Requiring Ultra-Thin Wafers," Solid State Technology, pp. 10-12, Feb. 2010.

* cited by examiner

*Primary Examiner* — Luan C Thai
(74) *Attorney, Agent, or Firm* — Sherry W. Schumm (57) ABSTRACT

Various embodiments of semiconductor manufacturing methods include releasing a transparent carrier from a semiconductor wafer assembly that includes a semiconductor wafer in which a plurality of semiconductor devices are formed, an adhesive layer coupled to the semiconductor wafer, a carrier release layer coupled to the adhesive layer, and the transparent carrier coupled to the carrier release layer. The method further includes controlling a laser system to emit a first beam characterized by first laser parameters toward the adhesive layer, where the first laser parameters are selected so that the first beam will compromise a physical integrity of the adhesive layer. The method further includes, after controlling the laser system to emit the first beam toward the adhesive layer, removing the adhesive layer from the semiconductor wafer.

20 Claims, 6 Drawing Sheets

METHODS FOR REMOVING ADHESIVE LAYERS FROM SEMICONDUCTOR WAFERS

TECHNICAL FIELD

Embodiments of the subject matter described herein relate generally to semiconductor manufacturing, and more particularly to removing adhesives from a semiconductor wafer.

BACKGROUND

Prior to performing a backgrinding operation to thin a semiconductor wafer during manufacturing, the wafer is mounted to a glass carrier to provide mechanical stability to the wafer. More particularly, a conventional process includes applying a light to heat conversion (LTHC) release layer to the glass carrier, and then attaching the wafer to the LTHC release layer with an adhesive. After the backgrinding operation, a laser is used to compromise the LTHC release layer, and the glass substrate is removed. The adhesive is then peeled from the wafer. In some instances, particularly when irregular features are present along the edge of the wafer and/or in the saw streets, the adhesive may not peel easily from the wafer. In such cases, the adhesive may tear during removal, and/or undesirable adhesive residue may remain on the wafer after removal of the bulk of the adhesive.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of the inventive subject matter include methods and apparatus for removing adhesive or other layers from the surface of a substrate. For example, the methods and apparatus may be utilized to remove an adhesive layer from the surface of a semiconductor wafer in the context of a semiconductor manufacturing process, as will be described in more detail later. According to various embodiments, prior to peeling an adhesive layer from a semiconductor wafer, a laser beam is used to compromise the physical integrity of a portion of the adhesive layer that is connected to a semiconductor wafer. For example, the laser beam may be used to selectively ablate a portion of the adhesive layer that overlies an edge region of the semiconductor wafer. As used herein, the term "ablate" means to remove, destroy, or otherwise compromise the physical integrity of a substance. For example, in various embodiments, laser ablation of a portion of an adhesive layer is used to compromise the physical integrity of the portion of the adhesive layer so that the mechanical adhesion between the adhesive layer and the semiconductor wafer is reduced in the ablated area. In other words, the selective laser ablation of the adhesive layer significantly decreases the strength of adhesion between the adhesive layer and the semiconductor wafer so that the adhesive layer may be more easily peeled from the semiconductor wafer in the ablated area.

Figure 1:
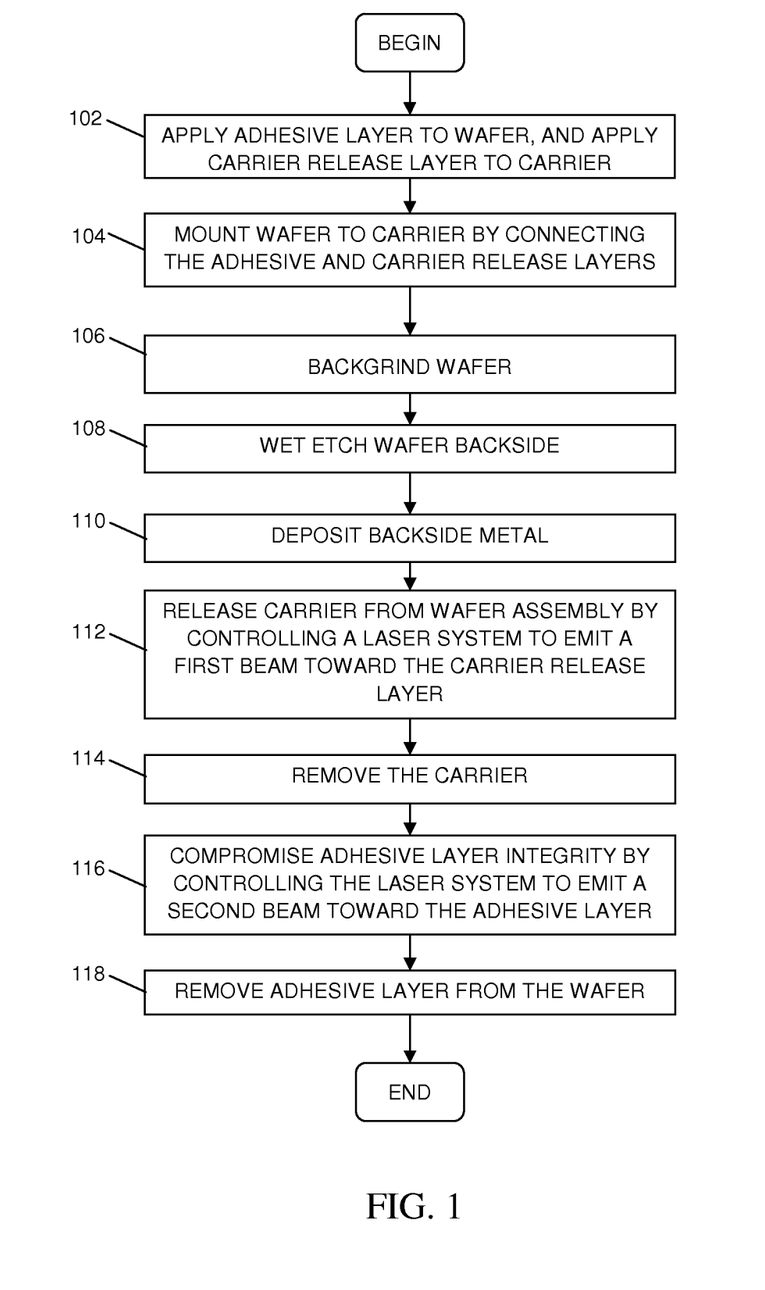
FIG. 1 is a flowchart of a portion of a method of manufacturing semiconductor devices included within a semiconductor wafer, in accordance with an example embodiment.

FIG. 1 is a flowchart of a portion of a method of manufacturing semiconductor devices included within a semiconductor wafer, in accordance with an example embodiment. FIG. 1 should be viewed in conjunction with FIGS. 2-10, which depict semiconductor wafer assemblies during various steps of the method of FIG. 1. Essentially, the portion of the semiconductor device manufacturing process conveyed in FIGS. 1-10 includes mounting a semiconductor wafer to a wafer support carrier, which provides mechanical stability to the wafer, performing a wafer thinning operation (e.g., backgrinding), and demounting the semiconductor wafer from the wafer support carrier after the wafer thinning operation.

Figure 2:
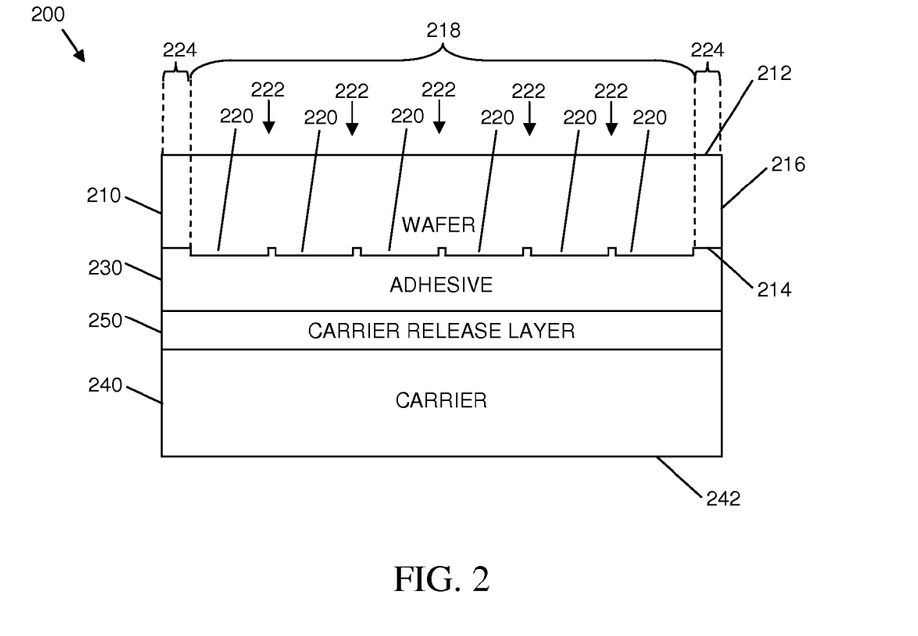
FIG. 2 is a side-view of a wafer assembly, which includes a wafer coupled to a carrier prior to performing a wafer backgrinding operation.

Referring also to FIG. 2, which depicts a side-view of a wafer assembly 200 at a first stage of manufacturing, the semiconductor manufacturing method may begin, in blocks 102 and 104, by forming the semiconductor wafer assembly 200. According to an embodiment, the semiconductor wafer assembly 200 includes a semiconductor wafer 210, and adhesive layer 230 coupled to a first surface 214 of the semiconductor wafer 210, a carrier release layer 250 coupled to the adhesive layer 230, and a transparent wafer support carrier 240 coupled to the carrier release layer 250. A second surface 212 of the semiconductor wafer 210 defines one outer surface of the semiconductor wafer assembly 200, and a surface 242 of the carrier 250 defines another outer surface of the semiconductor wafer assembly 200.

Figure 7:
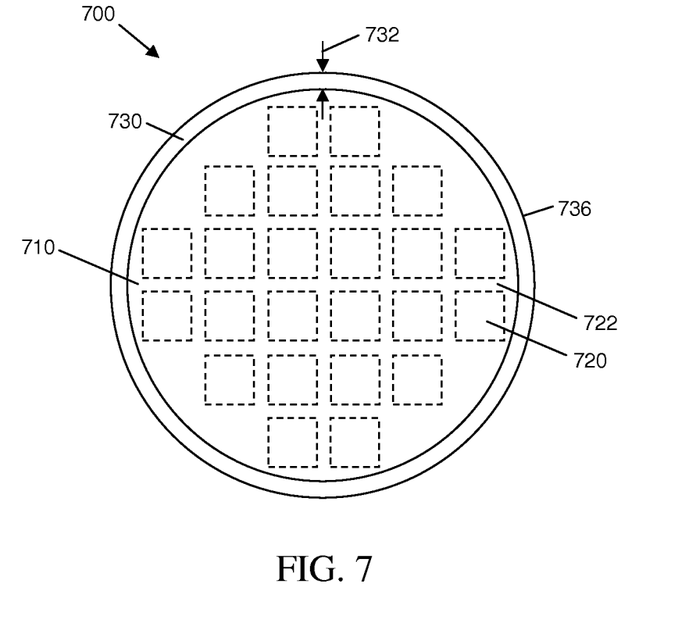
FIG. 7 is a top view of a wafer assembly depicting a lasered area of an adhesive layer, according to an example embodiment.
Figure 8:
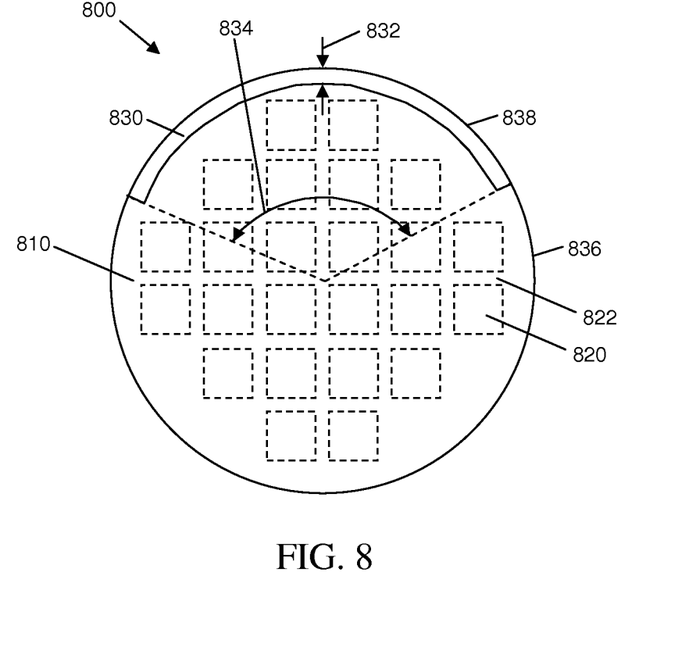
FIG. 8 is a top view of a wafer assembly depicting a lasered area of an adhesive layer, according to another example embodiment.
Figure 9:
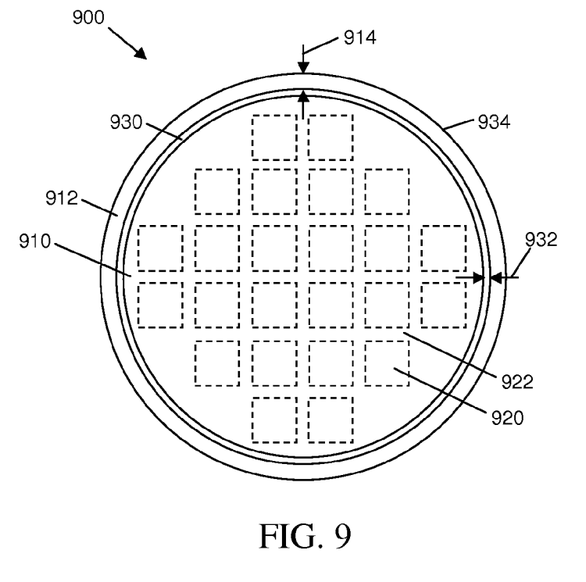
FIG. 9 is a top view of a wafer assembly depicting a lasered area of an adhesive layer, according to yet another example embodiment.

Semiconductor wafer 210 may be, for example, a silicon wafer, a silicon-on-insulator wafer, a gallium nitride (GaN) wafer, a gallium arsenide (GaAs) wafer, or virtually any other type of semiconductor wafer comprising one or more semiconductor materials. Semiconductor wafer 210 may include a plurality of devices 220 formed on and below the first surface 214 of the semiconductor wafer 210. For example, as also depicted in FIGS. 7-9 (each representing a top view of a semiconductor wafer assembly), the devices 220 (or devices 720, 820, 920, FIGS. 7-9) may be arranged in an array pattern within a substantially central device region 218 of the semiconductor wafer 210. Sacrificial isolation zones, referred to herein as "saw streets" 222 (or saw streets 722, 822, 922, FIGS. 7-9), may separate distinct devices 220. Devices 220 typically are not formed within an edge region 224 of the semiconductor wafer 210. The edge region 224 extends between the sides 216 (or the perimeter) of the semiconductor wafer 210 to the device region 218. According to an embodiment, the edge region 224 may have a width (i.e., the dimension parallel to surface 214 extending from side 216 to the perimeter of the device region 218) in a range of about 1.0 millimeters (mm) to about 10.0 mm, although the width of the edge region 224 may be greater or smaller, as well.

Each of the devices 220 may include combinations of one or more active devices (e.g., transistors), passive devices (e.g., resistors, capacitors, inductors), transducers (e.g., micro-electromechanical system (MEMS) devices), and associated conductive interconnects and isolation structures. The devices 220 may give the first surface 214 an uneven topography, as indicated in FIG. 2.

To form the semiconductor wafer assembly 200, in block 102, the adhesive layer 230 is applied to the first surface 214 of the semiconductor wafer 210, and the carrier release layer 250 is applied to a surface of the carrier 240. According to an embodiment, the adhesive layer 230 is applied to the semiconductor wafer 210 by spin-coating curable adhesive material on the first surface 214 of the semiconductor wafer 210, although other adhesive application methods may be used, as well. For example, the adhesive layer 230 may be formed from a combination of one or more materials including an acrylic, a polymer, or other suitable materials. Adhesive layer 230 may have a thickness in a range of about 20 microns to about 100 microns, although the adhesive layer 230 may be thicker or thinner, as well. The carrier release layer 250 may be coated on the surface of the carrier 240. For example, the carrier release layer 250 may include a light to heat conversion (LTHC) material, such as a thermoplastic resin. Other materials also may be used.

In block 104, the semiconductor wafer 210 (with the adhesive layer 230 attached) is mounted to the carrier 240 (with the carrier release layer 250 attached) to form the semiconductor wafer assembly 200. For example, the adhesive and carrier release layers 230, 250 may be brought together mechanically in a chamber, the pressure in the chamber may be reduced using vacuum, the temperature in the chamber may be increased, and ultraviolet (UV) energy may be applied to the semiconductor wafer assembly 200 to cure the adhesive layer 230, thus mechanically coupling the adhesive and carrier release layers 230, 250. Alternative methods also may be used to mount the semiconductor wafer 210 to the carrier 240, in other embodiments.

Figure 3:
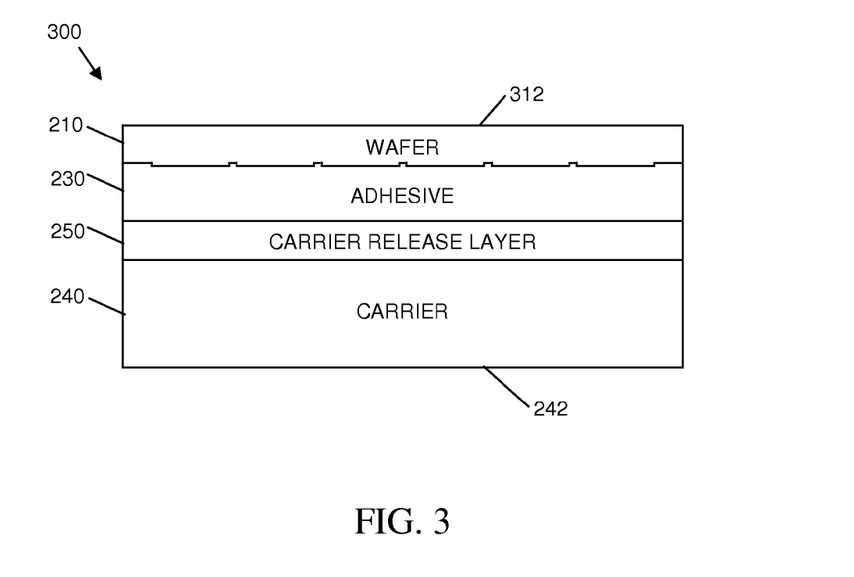
FIG. 3 is a side-view of the wafer assembly after performing the wafer backgrinding operation.

Referring also to FIG. 3, which is a side-view of the wafer assembly 300 at a second stage of manufacturing, a backgrinding operation is performed in block 106 to thin the semiconductor wafer 210 to its final thickness. In addition, the thinning operation may expose ends of conductive through-substrate vias (TSVs). For example, the final wafer thickness may be in a range of about 50 microns to about 200 microns, although the final wafer thickness may be thicker or thinner, as well. After the backgrinding operation, the newly exposed semiconductor wafer surface 312 may be etched, in block 108, in order to alleviate stresses in the semiconductor wafer 210 due to microscopic scratches imparted during the backgrinding operation. For example, a wet etching process may be performed to return the surface 312 substantially to monocrystalline semiconductor material. In block 110, one or more layers of backside metal (not illustrated) may be deposited on surface 312 to provide backside terminals for the devices 220, and/or to facilitate connection of the backsides of the later singulated devices 220 to distinct substrates. Deposition of the backside metal may be performed by sputtering or by using other deposition processes. Any of a variety of backside metals may be used, including for example, gold, silver, titanium, nickel, nickel vanadium, copper, and so on.

Figure 4:
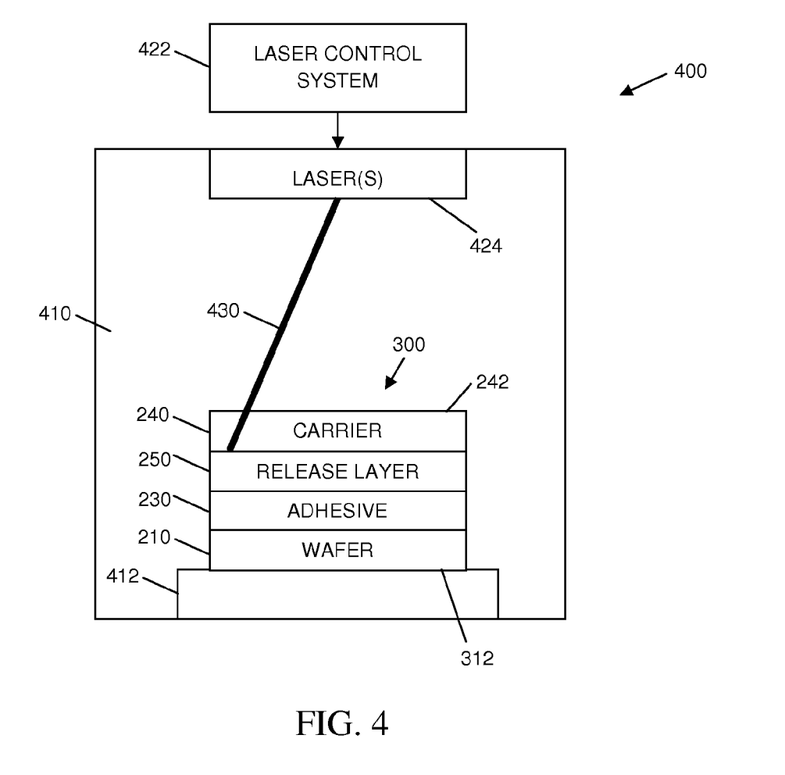
FIG. 4 is a side-view of a wafer processing system with a wafer assembly within a chamber, and during a carrier demount operation.

Referring also to FIG. 4, a side-view of a wafer processing system 400 is illustrated. Using the wafer processing system 400, a demount operation is performed, in block 112, in order to release the carrier 240 from the semiconductor wafer 210. More particularly, wafer processing system 400 includes a laser controller 422, a laser system 424 that includes one or more lasers, a chamber 410, and a wafer assembly support table 412, in an embodiment.

During the demount operation, the semiconductor wafer assembly 300 is placed within the chamber 410 with the wafer 210 (or surface 312) facing and supported by the wafer assembly support table 412, and with the transparent carrier 240 (or surface 242) facing toward the laser system 424. The laser controller 422 causes a laser of the laser system 424 to emit and direct a laser beam 430 toward the semiconductor wafer assembly 300. More particularly, the laser beam 430 is directed through the transparent carrier 240 toward the carrier release layer 250, and the laser beam 430 is characterized by first laser parameters that are selected so that the laser beam 430 will compromise the physical integrity of (e.g., ablate) the carrier release layer 250. The laser parameters may include, for example, specific values for laser power, wavelength, pulse frequency, pulse duty cycle, and speed of motion across the surface of the layer at which the laser beam is directed. For example, when the carrier release layer 250 is an LTHC layer, the characteristics of the laser beam 430 are such that the LTHC layer will absorb sufficient energy from the laser beam 430 to heat the LTHC layer to a temperature at which it is ablated or otherwise destroyed or physically compromised to the point that the LTHC layer no longer is capable of adhering the transparent carrier 240 to the rest of the semiconductor wafer 210. The characteristics of the laser beam 430 are not configured to substantially physically compromise the underlying adhesive layer 230, however.

According to an embodiment, during the demount operation, the laser system 424 is controlled to move the laser beam 430 in a raster pattern across an entirety of the carrier release layer 250. According to one embodiment, the laser system 424 operates in a continuous wave mode during the demount operation, in which the laser beam 430 is continuously directed toward the carrier release layer 250. According to another embodiment, the laser system 424 operates in a pulsed mode during the demount operation, in which the laser beam 430 is pulsed as it is directed toward the carrier release layer 250. For example, the laser beam 430 may be pulsed at a frequency in a range of about 1 kilohertz (kHz) to about 1000 kHz, and a duty cycle of the pulses may be in a range of about 20 percent to about 80 percent of the pulse period. According to a further embodiment, the power of laser beam 430 may be in a range of about 20 watts (W) to about 120 W. According to another further embodiment, the wavelength of laser beam 430 may be in a range of about 300 nanometers (nm) to about 1100 nm. Although specific example ranges have been given above for various laser parameters (e.g., pulse frequency, pulse duty cycle, power, and wavelength), other embodiments may utilize laser parameters that are higher and/or lower than the above-given ranges.

The laser controller 422 may include, for example, a user interface (e.g., keyboard, display, mouse, buttons, dials, and so on), one or more removable media interfaces (e.g., USB ports, CD drives, and so on), one or more wired or wireless communication interfaces, and a processor system (e.g., including one or more microprocessors, memory, and so on). The user interface enables a human operator to provide inputs to the wafer processing system 400 that affect operation of the system 400 (e.g., initiate and/or terminate a laser generation operation and/or change laser parameters), and also to monitor the operational status of the system. Essentially, based on laser parameters stored in or accessible to the laser controller 422, the laser controller 422 provides control signals to the laser system 424, causing the laser system 424 to emit and direct a laser beam characterized by the laser parameters toward a target in the chamber 410.

According to an embodiment, the laser system 424 may include one or more $CO_2$ lasers, solid state lasers (e.g., doped yttrium aluminum garnet (YAG) lasers), fiber lasers, diode lasers, or other types of lasers. The laser(s) of the laser system 424 may be capable of operating in continuous wave and/or pulsed modes of operation, as mentioned above. According to an embodiment, the laser beams (e.g., beams 430 630, FIGS. 4, 6) produced by the laser(s) of the laser system 424 may be directed toward and moved over a target (e.g., semiconductor wafer assembly 300) using one or more mirror galvanometers (galvos), which direct a laser beam toward a reflective surface, and move the reflective surface to move the laser beam across a surface. In other embodiments, other methods for directing and moving the laser beams may be employed.

Figure 5:
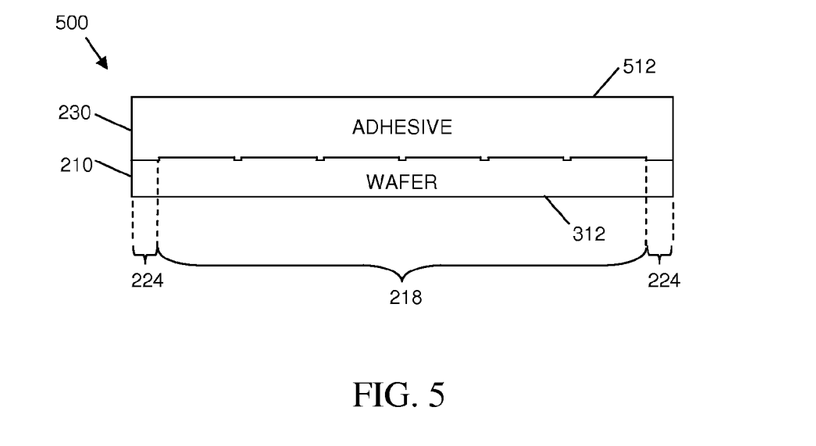
FIG. 5 is a side-view of the wafer assembly after performing the carrier demount operation.

Once the physical integrity of the carrier release layer 250 has been sufficiently compromised (i.e., the carrier 240 has been released), the carrier 240 may then be removed from the semiconductor wafer 220, in block 114, according to an embodiment. In another embodiment, the carrier 240 may be removed at a later point in the process (e.g., after block 116). FIG. 5 is a side-view of the wafer assembly 500 after performing the carrier demount operation. Once the carrier 240 has been removed, the top surface of the assembly 500 is defined by the top surface 512 of the adhesive layer 230.

Figure 6:
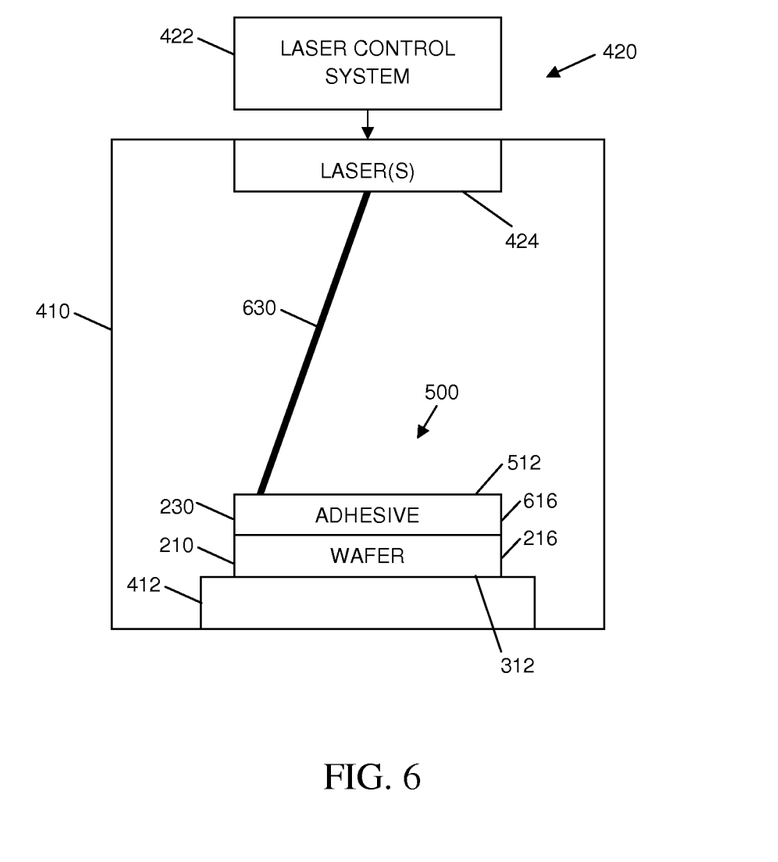
FIG. 6 is a side-view of the laser system of FIG. 4 during an adhesive lasering operation, according to an example embodiment.

In block 116, and according to an embodiment, the laser system 424 is then controlled to compromise the physical integrity of one or more portions of the adhesive layer 230, according to an embodiment. This process may be carried out using the same laser system 424 as was used during the demount operation of block 112, in an embodiment, although it may be carried out using a different laser system, as well. Assuming that the same laser system 424 is used, FIG. 6 illustrates the semiconductor wafer assembly 500 of FIG. 5 within the chamber 410 of the laser system 424 during an adhesive lasering operation, according to an example embodiment.

During the adhesive lasering operation, the semiconductor wafer assembly 500 is oriented within the chamber 410 with the wafer 210 (or surface 312) facing the wafer assembly support table 412, and with the adhesive layer 230 (or surface 512) facing toward the laser system 424. The laser controller 422 causes a laser of the laser system 424 to emit and direct a laser beam 630 toward the semiconductor wafer assembly 500. More particularly, the laser beam 630 is directed toward one or more portions of the adhesive layer 230 (referred to as "the lasered area of the adhesive layer"), as will be described more fully below. The laser beam 430 is characterized by second laser parameters that are selected so that the laser beam 630 will compromise the physical integrity of (e.g., ablate) the lasered area of the adhesive layer 230. For example, the characteristics of the laser beam 630 are such that the lasered area of the adhesive layer 230 will absorb sufficient energy from the laser beam 630 to heat the lasered area of the adhesive layer 230 to a temperature at which the lasered area of the adhesive layer 230 is ablated or otherwise destroyed or physically compromised to the point that the lasered area of the adhesive layer 230 is sufficiently less capable of adhering to the semiconductor wafer 210 than are non-lasered portions of the adhesive layer 230.

According to one embodiment, the laser system 424 operates in a continuous wave mode during the adhesive lasering operation, in which the laser beam 630 is continuously directed toward the adhesive layer 230. According to another embodiment, the laser system 424 operates in a pulsed mode during the adhesive lasering operation, in which the laser beam 630 is pulsed as it is directed toward the adhesive layer 230. For example, the laser beam 630 may be pulsed at a frequency in a range of about 1 kilohertz (kHz) to about 1000 kHz, and a duty cycle of the pulses may be in a range of about 20 percent to about 80 percent of the pulse period. According to a further embodiment, the power of laser beam 630 may be in a range of about 100 W to about 300 W. According to another further embodiment, the wavelength of laser beam 630 may be in a range of about 300 nm to about 1100 nm. In any event, the laser parameters used during the adhesive lasering process may be different from the laser parameters used during the demount operation. More particularly, the laser parameters used during the adhesive lasering process may result in a laser beam 630 with significantly higher power, longer duty cycle, and/or shorter wavelength (or higher frequency) being directed toward the adhesive layer 230 than the laser beam 430 that was directed toward the carrier release layer 250 during the demount operation. In addition or alternatively, the speed at which the laser beam 630 is moved across the adhesive layer 230 may be significantly slower than the speed at which the laser beam 430 was moved across the carrier release layer 250 during the demount operation. Although specific example ranges have been given above for various laser parameters (e.g., pulse frequency, pulse duty cycle, power, and wavelength), other embodiments may utilize laser parameters that are higher and/or lower than the above-given ranges.

According to an embodiment, during the adhesive lasering operation, the laser system 424 is controlled to move the laser beam 630 in a pattern across one or more portions of the adhesive layer 230, as mentioned above. The lasered area of the adhesive layer 230 may include any portions that do not overlie semiconductor devices (e.g., semiconductor devices 220, FIG. 2). In other words, the laser system 424 is controlled to direct the laser beam 630 only toward one or more portions of the adhesive layer 230 that do not overlie the semiconductor devices. For example, the laser system 424 may be controlled to direct the laser beam 630 toward a portion of the adhesive layer 230 that is proximate to an edge (or perimeter) of the adhesive layer, and/or toward a portion of the adhesive layer 230 that overlies saw streets of the semiconductor wafer 210. More specifically, the lasered area may include, for example, portions of the adhesive layer 230 overlying some or all portions of the edge region of the semiconductor wafer 210 (e.g., edge region 224, FIG. 2) and overlying some or all portions of the saw streets (e.g., saw streets 222, FIG. 2), for example. Although all of these portions of the adhesive layer 230 may be lasered, in an embodiment, in other embodiments fewer than all of these portions of the adhesive layer 230 are lasered. Several example embodiments of lasered areas of an adhesive layer are depicted in FIGS. 7-9. In the embodiments of FIGS. 7-9, the perimeters of the adhesive layers and the perimeters of the underlying semiconductor wafers are substantially the same (i.e., the adhesive layers and the semiconductor wafers have the same diameters).

For example, FIG. 7 is a top view of a wafer assembly 700 depicting a lasered area 730 of an adhesive layer 710 overlying a semiconductor wafer, according to an example embodiment. As discussed previously, an edge region of the semiconductor wafer (e.g., edge region 224, FIG. 2) corresponds to portions of the semiconductor wafer between the semiconductor devices 720 and the perimeter 736 of the semiconductor wafer, and saw streets 722 correspond to sacrificial portions of the semiconductor wafer running in orthogonal directions between adjacent semiconductor devices 720.

In FIG. 7, the lasered area 730 of the adhesive layer 710 corresponds to a portion of the adhesive layer 710 that extends around the entire perimeter 736 of the semiconductor wafer. More specifically, the lasered area 730 overlies the edge region of the semiconductor wafer, and extends all the way to the perimeter 736 of the semiconductor wafer. According to an embodiment, a width 732 of the lasered area 730 is less than the minimum width of the edge region (i.e., the distance between the perimeter 736 and the semiconductor device(s) 720 that are closest to the perimeter 736) to ensure that the laser beam 630 used during the adhesive lasering process does not impact semiconductor devices 720 adjacent to the edge region. For example, when the minimum width of the edge region is in a range of about 1.0 mm to about 10.0 mm, the width 732 of the lasered area 730 may be in a range of about 0.9 mm to about 9.9 mm, respectively, although the width of the lasered area 730 may be greater or smaller, as well. According to an embodiment, the width of the lasered area 730 is between about 10 percent to about 95 percent of the minimum width of the edge region. According to another embodiment, the width of the lasered area 730 is at least 50 percent of the minimum width of the edge region.

FIG. 8 is a top view of a wafer assembly 800 depicting a lasered area 830 of an adhesive layer 810 overlying a semiconductor wafer, according to another example embodiment. In FIG. 8, the lasered area 830 of the adhesive layer 810 corresponds to a portion of the adhesive layer 810 that extends around only a segment 838 of the perimeter 836 of the semiconductor wafer. For example, the segment 838 of the perimeter 836 of the semiconductor wafer may be between about 10 percent to about 50 percent of the entire perimeter 836 of the semiconductor wafer (e.g., angle 834 may be between about 36 degrees to about 180 degrees), although the segment 838 may be shorter or longer, as well.

Similar to the embodiment of FIG. 7, the lasered area 830 overlies the edge region of the semiconductor wafer, and extends all the way to the perimeter 836 of the semiconductor wafer. A width 832 of the lasered area 830 is less than the minimum width of the edge region (i.e., the distance between the perimeter 836 and the semiconductor device(s) 820 that are closest to the perimeter 836) to ensure that the laser beam 630 used during the adhesive lasering process does not impact semiconductor devices 820 adjacent to the edge region. For example, when the minimum width of the edge region is in a range of about 1.0 mm to about 10.0 mm, the width 832 of the lasered area 830 may be in a range of about 0.9 mm to about 9.9 mm, respectively, although the width of the lasered area 830 may be greater or smaller, as well. According to an embodiment, the width of the lasered area 830 is between about 10 percent to about 95 percent of the minimum width of the edge region. According to another embodiment, the width of the lasered area 830 is at least 50 percent of the minimum width of the edge region.

In the embodiments of FIGS. 7 and 8, the lasered areas 730, 830 extend all the way to the perimeters 736, 836 of the underlying semiconductor wafers. In an alternate embodiment, a lasered area may not extend all the way to the perimeter of the underlying semiconductor wafer, but instead may be inset from the perimeter. For example, FIG. 9 is a top view of a wafer assembly 900 depicting an inset lasered area 930 of an adhesive layer 910 overlying a semiconductor wafer, according to yet another example embodiment. In the embodiment of FIG. 9, the lasered area 930 of the adhesive layer 910 overlies the edge region of the semiconductor wafer. However, the lasered area 930 is inset from the perimeter 934 of the underlying semiconductor wafer, leaving an un-lasered area 912 between the lasered area 930 and the perimeter 934. For example, the lasered area 930 may be inset from the perimeter 934 by a width 914 of about 5 percent to about 50 percent of the minimum width of the edge region, and the lasered area 930 may have a width 932 between about 10 percent to about 85 percent of the minimum width of the edge region. In alternate embodiments, the above given ranges may be greater or smaller.

In the embodiment illustrated in FIG. 9, the lasered area 930 extends around an entire perimeter 934 of the semiconductor wafer. However, in other embodiments, an inset lasered area may extend around only a segment of the perimeter of the semiconductor wafer (e.g., as in the embodiment of FIG. 8).

Figure 10:
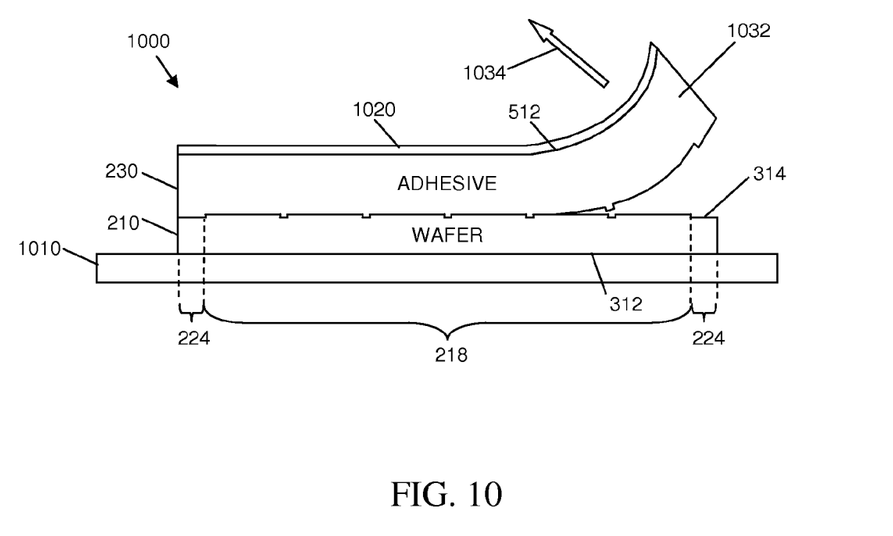
FIG. 10 is a side-view of the wafer assembly of FIG. 5 after performing the adhesive lasering operation and during an adhesive removal operation, according to an example embodiment.

Performance of the adhesive lasering operation reduces the strength of adhesion of the adhesive layer 230 to the surface of the semiconductor wafer 210, thus reducing the pull strength needed to remove the adhesive layer 230 from the semiconductor wafer 210 in the lasered areas of the adhesive layer 230. Referring again to FIG. 1, after performing the adhesive lasering operation, the adhesive layer 230 is removed from the semiconductor wafer 210 in block 118. FIG. 10 is a side-view of a wafer assembly 1000 after performing the adhesive lasering operation and during an adhesive removal operation, according to an example embodiment. Removal of the adhesive layer 230 includes placing the wafer assembly 1000 on a rigid surface 1010 (e.g., a vacuum chuck), applying a flexible and highly adhesive substrate 1020 to the top surface 512 of the adhesive layer 230, and then peeling the adhesive substrate 1020 and adhesive layer 230 from the top surface 314 of the semiconductor wafer 210. According to an embodiment, the adhesive substrate 1020 has a significantly stronger strength of adhesion to the adhesive layer 230 than the strength of adhesion that the adhesive layer 230 has to the semiconductor wafer 210 in the lasered area 1032 of the adhesive layer 230. Peeling or removal of the adhesive layer 230 is initiated at a portion of the adhesive layer 230 that is proximate to the edge or perimeter of the adhesive layer 230, or more specifically at a portion of the perimeter that corresponds to a lasered area 1032 of the adhesive layer 230. For example, a roller may be brought into contact with a portion of the adhesive substrate 1020 overlying the lasered area 1032 of the adhesive layer 230, and the roller may be rolled across the adhesive substrate 1020 toward a center of the semiconductor wafer 210. This action applies an upward force, indicated by arrow 1034, on the adhesive substrate 1020 and the lasered area 1032 of the adhesive layer 230, thus pulling the lasered area 1032 of the adhesive layer 230 away from the surface 314 of the semiconductor wafer 210 in the edge region 224. The roller may continue across the surface of the adhesive substrate 1020, thus pulling the remainder of the adhesive layer 230 from the central device region 218 and the portion of the edge region 224 opposite the portion at which removal of the adhesive layer 230 was initiated. In alternate embodiments, other methods of peeling the adhesive layer 230 may be employed, although those other methods also may initiate removal of the adhesive layer 230 at a portion of the adhesive layer 230 that corresponds to or is proximate to a portion of a lasered area of the adhesive layer 230 and the perimeter of the semiconductor wafer 210.

In the above-described embodiments, and as described previously, the wafer processing system 400 includes a laser controller 422 and a laser system 424 that includes one or more lasers. The laser controller 422 causes the laser(s) of the laser system 424 to emit and direct laser beams 430, 630 toward the semiconductor wafer assembly during both the carrier demount and adhesive lasering operations (e.g., during blocks 112 and 116). As also mentioned previously, the laser parameters that define the characteristics and movement of the laser beams 430, 630 are different from each other. More specifically, the laser parameters that define the characteristics and movement of laser beam 430 used during the carrier demount operation are configured to compromise the physical integrity of the carrier release layer 250, and the laser parameters that define the characteristics and movement of the laser beam 630 used during the adhesive lasering operation are configured to compromise the physical integrity of the adhesive layer 230. According to an embodiment, the carrier demount laser settings and the adhesive lasering laser settings may be stored in memory of the laser controller 422, and the laser controller 422 may execute software modules that utilize each set of laser settings to cause the laser system 424 to produce the laser beams 430, 630 at appropriate times during the wafer manufacturing process.

Various embodiments of semiconductor manufacturing methods are disclosed herein. An embodiment of a semiconductor manufacturing method includes releasing a transparent carrier from a semiconductor wafer assembly. The semiconductor wafer assembly includes a semiconductor wafer in which a plurality of semiconductor devices are formed, an adhesive layer coupled to the semiconductor wafer, a carrier release layer coupled to the adhesive layer, and the transparent carrier coupled to the carrier release layer. The method further includes controlling a laser system to emit a first beam characterized by first laser parameters toward the adhesive layer, where the first laser parameters are selected so that the first beam will compromise a physical integrity of the adhesive layer. The method further includes, after controlling the laser system to emit the first beam toward the adhesive layer, removing the adhesive layer from the semiconductor wafer.

Another embodiment of a semiconductor manufacturing method includes controlling a laser system to emit a first beam characterized by first laser parameters toward an LTHC release layer of a semiconductor wafer assembly. The semiconductor wafer assembly includes a semiconductor wafer, an adhesive layer coupled to the semiconductor wafer, the LTHC release layer coupled to the adhesive layer, and a transparent carrier coupled to the LTHC layer. The first laser parameters are selected so that the first beam will compromise a physical integrity of the LTHC layer. The method further includes controlling the laser system to emit a second beam characterized by second laser parameters toward the adhesive layer, where the second laser parameters are different from the first laser parameters, and the second laser parameters are selected so that the second beam will compromise a physical integrity of the adhesive layer.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor manufacturing method comprising:
   releasing a transparent carrier from a semiconductor wafer assembly, wherein the semiconductor wafer assembly includes a semiconductor wafer in which a plurality of semiconductor devices are formed, an adhesive layer coupled to the semiconductor wafer, a carrier release layer coupled to the adhesive layer, and the transparent carrier coupled to the carrier release layer;
   controlling a laser system to emit a first beam characterized by first laser parameters toward the adhesive layer, wherein the first laser parameters are selected so that the first beam will compromise a physical integrity of the adhesive layer; and
   after controlling the laser system to emit the first beam toward the adhesive layer, removing the adhesive layer from the semiconductor wafer.

2. The method of claim 1, wherein controlling the laser system to emit the first beam toward the adhesive layer comprises directing the first beam only toward one or more portions of the adhesive layer that do not overlie the semiconductor devices.

3. The method of claim 2, wherein the one or more portions of the adhesive layer include a portion of the adhesive layer that overlies an edge region of the semiconductor wafer.

4. The method of claim 3, wherein the portion of the adhesive layer that overlies the edge region extends around an entire perimeter of the semiconductor wafer.

5. The method of claim 3, wherein the portion of the adhesive layer that overlies the edge region extends around only a segment of a perimeter of the semiconductor wafer, wherein the segment of the perimeter of the semiconductor wafer is between 10 percent to 50 percent of the perimeter of the semiconductor wafer.

6. The method of claim 3, wherein removing the adhesive layer comprises initiating removal of the adhesive layer at the portion of the adhesive layer that overlies the edge region of the semiconductor wafer.

7. The method of claim 2, wherein the one or more portions of the adhesive layer include a portion of the adhesive layer that overlies an edge region of the semiconductor wafer, and is inset from a perimeter of the semiconductor wafer.

8. The method of claim 1, wherein the first laser parameters comprise wavelengths in a range from 300 nanometers to 1100 nanometers, and power levels in a range from 100 watts to 300 watts.

9. The method of claim 1, wherein releasing the carrier release layer comprises controlling the laser system to emit a second beam characterized by second laser parameters toward the carrier release layer, wherein the second laser parameters are different from the first laser parameters, and the second laser parameters are selected so that the second beam will compromise a physical integrity of the carrier release layer.

10. The method of claim 1, further comprising:
after releasing the carrier layer and before controlling the laser system to emit the first beam toward the adhesive layer, removing the carrier from the semiconductor wafer.

11. The method of claim 1, further comprising producing the semiconductor wafer assembly by:
applying the adhesive layer to the semiconductor wafer;
applying the carrier release layer to the transparent carrier;
connecting together the adhesive layer and the carrier release layer;
backgrinding the semiconductor wafer;
etching a backside of the semiconductor wafer; and
depositing a backside metal to the backside of the semiconductor wafer.

12. A semiconductor manufacturing method comprising:
controlling a laser system to emit a first beam characterized by first laser parameters toward a light to heat conversion (LTHC) release layer of a semiconductor wafer assembly that includes a semiconductor wafer, an adhesive layer coupled to the semiconductor wafer, the LTHC release layer coupled to the adhesive layer, and a transparent carrier coupled to the LTHC release layer, wherein the first laser parameters are selected so that the first beam will compromise a physical integrity of the LTHC layer; and
controlling the laser system to emit a second beam characterized by second laser parameters toward the adhesive layer, wherein the second laser parameters are different from the first laser parameters, and the second laser parameters are selected so that the second beam will compromise a physical integrity of the adhesive layer.

13. The method of claim 12, wherein the first laser parameters comprise wavelengths in a range from 300 nanometers to 1100 nanometers, and power levels in a range from 20 watts to 120 watts.

14. The method of claim 12, wherein the second laser parameters comprise wavelengths in a range from 300 nanometers to 1100 nanometers, and power levels in a range from 100 watts to 300 watts.

15. The method of claim 12, wherein controlling the laser system to emit the first beam comprises directing the first beam toward a reflective surface, and moving the reflective surface to move the first beam across a surface of the LTHC release layer in a raster pattern.

16. The method of claim 12, wherein controlling the laser system to emit the second beam comprises directing the second beam toward a reflective surface, and moving the reflective surface to move the second beam across a portion of a surface of the adhesive layer that does not overlie semiconductor devices formed in the semiconductor wafer.

17. The method of claim 16, wherein the portion of the adhesive layer comprises a portion of the adhesive layer that overlies an edge region of the semiconductor wafer.

18. The method of claim 17, further comprising removing the adhesive layer by initiating removal of the adhesive layer at the portion of the adhesive layer that overlies the edge region of the semiconductor wafer.

19. The method of claim 12, wherein controlling the laser system to emit the second beam comprises operating the laser system in a continuous mode of operation.

20. The method of claim 12, wherein controlling the laser system to emit the second beam comprises operating the laser system in a pulsed mode of operation.

* * * * *